United States Patent
Xian et al.

(10) Patent No.: US 9,530,803 B2
(45) Date of Patent: Dec. 27, 2016

(54) ELECTRICAL CONNECTION STRUCTURE WITH VIA HOLE, ARRAY SUBSTRATE AND DISPLAY DEVICE

(71) Applicant: BOE TECHNOLOGY GROUP CO., LTD., Beijing (CN)

(72) Inventors: Jianbo Xian, Beijing (CN); Yong Qiao, Beijing (CN); Hongfei Cheng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/906,443

(22) PCT Filed: May 14, 2015

(86) PCT No.: PCT/CN2015/079000
§ 371 (c)(1),
(2) Date: Jan. 20, 2016

(87) PCT Pub. No.: WO2016/107050
PCT Pub. Date: Jul. 7, 2016

(65) Prior Publication Data
US 2016/0211274 A1 Jul. 21, 2016

(30) Foreign Application Priority Data
Dec. 30, 2014 (CN) .................... 2014 2 0860388 U (51) Int. Cl.
*H01L 27/12* (2006.01)
*H01L 23/522* (2006.01)
*H01L 33/42* (2010.01)

(52) U.S. Cl.
CPC ......... *H01L 27/124* (2013.01); *H01L 23/5226* (2013.01); *H01L 33/42* (2013.01); *H01L 2924/0002* (2013.01)

(58) Field of Classification Search
CPC ................... H01L 23/5226; H01L 2924/0002; H01L 2021/775; H01L 27/1251; H01L 27/3262; H01L 27/3248; H01L 31/0224; H01L 31/022466; H01L 31/1884
See application file for complete search history.

(56) References Cited

U.S. PATENT DOCUMENTS

2002/0135070 A1* 9/2002 Jeong ................ H01L 21/76895
257/764
2010/0053920 A1 3/2010 Zeng

FOREIGN PATENT DOCUMENTS

| CN | 101296580 A | 10/2008 |
|---|---|---|
| CN | 103022347 A | 4/2013 |
| CN | 103715228 A | 4/2014 |

OTHER PUBLICATIONS

Search Report and Written Opinion Mailed Oct. 10, 2015 from State Intellectual Property Office of the P.R. China.

* cited by examiner

*Primary Examiner* — Jasmine Clark
(74) *Attorney, Agent, or Firm* — Dilworth & Barrese, LLP.

(57) ABSTRACT

An electrical connection structure with a via hole, an array substrate and a display device are provided, and the electrical connection structure with the via hole includes: a first insulating layer disposed on a first electrical conductor and under a second electrical conductor and provided with a first via hole which overlaps the first electrical conductor and the second electrical conductor; and a conductive connection portion which passes through the first via hole, electrically connects the first electrical conductor to the second electrical conductor, and is electrically connected with at least one lateral surface of the first electrical conductor. The electrical connection structure with the via hole can solve the problem (Continued)

of a poor contact between the first electrical conductor and the conductive connection portion which is formed in the via hole.

20 Claims, 5 Drawing Sheets

ELECTRICAL CONNECTION STRUCTURE WITH VIA HOLE, ARRAY SUBSTRATE AND DISPLAY DEVICE

TECHNICAL FIELD

Embodiments of the present disclosure relate to an electrical connection structure with a via hole, an array substrate and a display device.

BACKGROUND

In a manufacturing process of an array substrate required by a display panel, signal-line conduction layers in different layers are usually connected through a via hole. For example: a drain electrode of a thin film transistor (hereinafter thin film transistor is short for TFT) disposed under an insulating layer and a pixel electrode disposed on the insulating layer are required to be connected, the insulating layer in the region where the drain electrode of the TFT overlaps the pixel electrode is usually provided with a via hole, and when the pixel electrode is formed, at the same time, a conductive connection portion having a same material as the pixel electrode is formed in the via hole, so that the drain electrode of the TFT and the pixel electrode are electrically connected through the conductive connection portion formed in the via hole.

SUMMARY

Embodiments of the present disclosure provide an electrical connection structure with a via hole, an array substrate and a display device, to solve the technical problem of a poor contact between a first electrical conductor and a conductive connection portion which is formed in a first via hole.

At least one embodiment of the present disclosure provides an electrical connection structure with a via hole, which includes: a first insulating layer which is disposed on a first electrical conductor and under a second electrical conductor and provided with a first via hole, an overlapping region being between the first via hole and each of the first electrical conductor and the second electrical conductor; and a conductive connection portion which passes through the first via hole, electrically connects the first electrical conductor to the second electrical conductor, and is electrically connected with at least one lateral surface of the first electrical conductor.

At least one embodiment of the present disclosure further provides an array substrate, and the array substrate includes the above-mentioned electrical connection structure with the via hole.

At least one embodiment of the present disclosure still further provides a display device, and the display device includes the above-mentioned array substrate.

BRIEF DESCRIPTION OF THE DRAWINGS

In order to clearly illustrate the technical solution of the embodiments of the disclosure, the drawings of the embodiments will be briefly described in the following, it is obvious that the described drawings are only related to some embodiments of the disclosure and thus are not limitative of the disclosure.

REFERENCE NUMERALS

10—electrical connection structure with via hole; 11—first electrical conductor; 12—second electrical conductor; 13—first insulating layer; 14—first via hole; 15—conductive connection portion; 16—lateral surface; 16a—outer lateral surface; 16b—inner lateral surface; 17—upper surface; 18—concave part; 19—hole-shaped concave part; 20—groove type concave part; 21—first conducting portion; 22—second conducting portion; 23—second insulating layer; 24—third electrical conductor; 25—connecting through-hole; 26—second via hole; 30—array substrate.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

In this study, the inventors of the present application noticed that, because the technological level or the adhesion performance of the conductive connection portion in a via hole is not good enough, or because the conductive connection portion is affected by the factors such as the shape of the via hole and the specific location of the via hole on a TFT drain electrode, the conductive connection portion is easy to fall off from the surface of the drain electrode, i.e., a poor contact occurs between the TFT drain electrode and the conductive connection portion which is formed in the via hole, and thus a poorer reliability of the electrical connection between the TFT drain electrode and a pixel electrode is caused.

Figure 1:
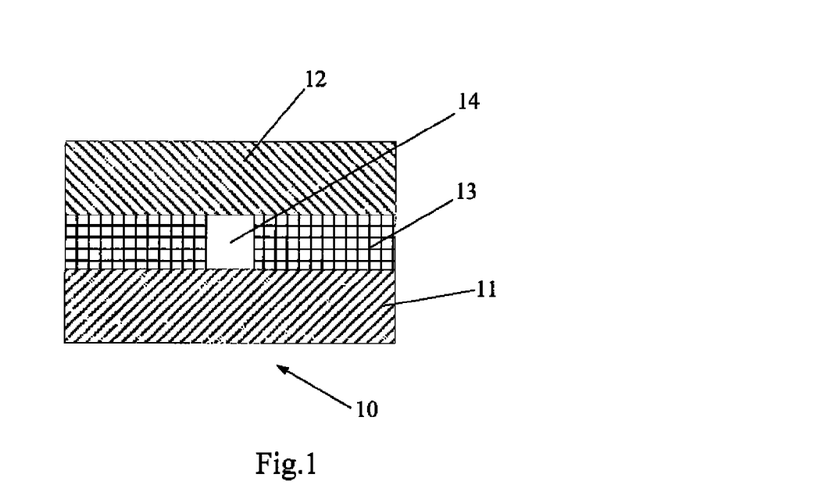
FIG. 1 is a sectional view of an electrical connection structure with a via hole in an embodiment of the present disclosure.
Figure 2:
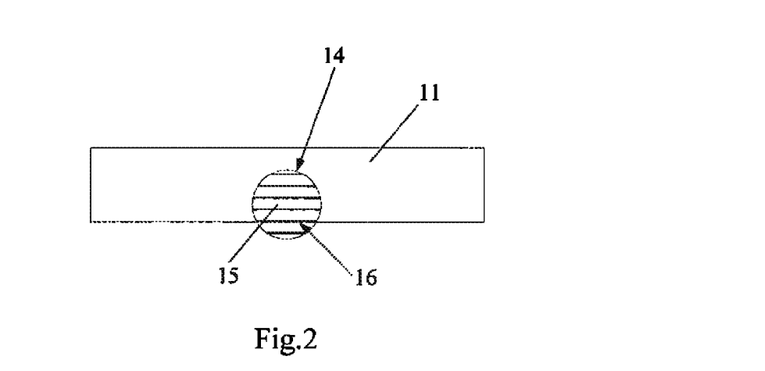
FIG. 2 is a top view of an arrangement mode of the via hole in FIG. 1.
Figure 3:
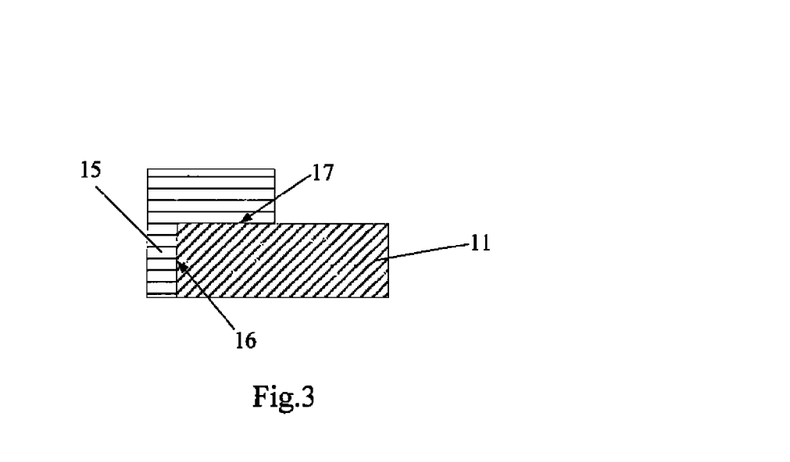
FIG. 3 is a sectional view of a conductive connection portion and a first electrical conductor in FIG. 1.

Referring to FIG. 1, FIG. 2 and FIG. 3, an electrical connection structure with a via hole 10 provided in at least one embodiment of the present disclosure includes: a first insulating layer 13 which is disposed on a first electrical conductor 11 and under a second electrical conductor 12 and provided with a first via hole 14 overlapping both the first electrical conductor 11 and the second electrical conductor 12; and a conductive connection portion 15 (for example, a conductive block) which passes through the first via hole 14, electrically connects the first electrical conductor 11 to the second electrical conductor 12, and electrically connects at least one lateral surface 16 of the first electrical conductor 11.

When the electrical connection structure with a via hole 10 provided by the embodiment of the present disclosure is formed between each first electrical conductor 11 and a corresponding second electrical conductor 12 which are provided in the array substrate, the conductive connection portion 15 in the first via hole 14 is electrically connected with at least one lateral surface 16 of the first electrical conductor 11; and in this way, compared with the electrical connection method that the conductive connection portion is only electrically connected with the upper surface of the first electrical conductor, the electrical connection area between the conductive connection portion 15 and the first electrical conductor 11 can be increased, thus the poor contact between the first electrical conductor 11 (for example a drain electrode of a thin film transistor) and the conductive connection portion 15 in the first via hole 14 can be effectively prevented, and further the reliability of the electrical connection between the first electrical conductor 11 and the second electrical conductor 12 can be improved.

Referring to FIG. 3, the electrical connection structure with a via hole 10 provided by an embodiment of the present disclosure is not limited to the conductive connection portion 15 being only electrically connected with at least one lateral surface 16 of the first electrical conductor 11, the conductive connection portion 15 can also be electrically connected with the upper surface 17 of the first electrical conductor 11.

It's to be noted that, the shape, in the top view, of the above-mentioned first via hole 14 is not limited to a circle as shown in FIG. 2, any other shape, in the top view, of the first via hole 14 is suitable for the embodiments of the present disclosure, and for example, the shape, in the top view, of the first via hole 14 can also be an oval, a triangle, a rectangle, or any other polygons.

Besides, unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a", "an", "the" etc., are not intended to limit the amount, but indicate the existence of at least one. The phrases "include", or "contain", etc., are intended to the component or the object in front of the word covers the component or the object and their equivalent that list behind the word appears, and not exclude the other components or components. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Besides, the electrical conductors and/or the insulating layer of the electrical connection structure with the via hole 10 described in embodiments of the present disclosure can be a single-layer or multi-layer structure, the layers of the multi-layer structure can have a same material or different materials; the material of the insulating layer can be an inorganic, organic or organic-inorganic composite material; each of the electrical conductors can be a conductor, or a semiconductor, etc., for example: the material of each electrical conductor can be a metal or an alloy, or a metal oxide, an organic semiconductor or other conductive material. Of course, the electrical connection structure with the via hole 10 can also include other dielectric functional layer which is disposed according to the requirement, the so-called other dielectric functional layer refers to including but not being limited to the structure which is not completely the same with the insulating layer, the first conductive layer or the second conductive layer in the function or the material.

In order to simplify the manufacturing process, the conductive connection portion 15 can be formed at the same time of forming the second electrical conductor 12, and in this case, the material of the second electrical conductor 12 is the same as the material of the conductive connection portion 15. For example, the conductive connection portion 15 is an indium tin oxide conductive connection portion, and the second electrical conductor 12 is an indium tin oxide electrical conductor.

Figure 4:
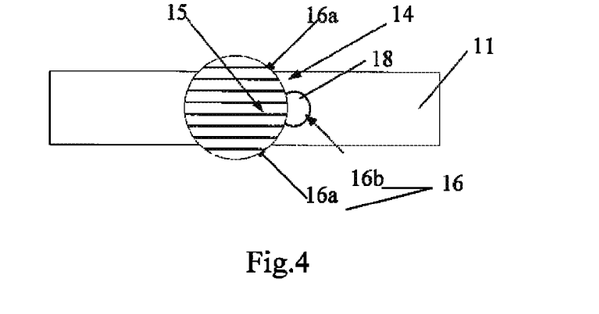
FIG. 4 is a top view of another arrangement mode of the via hole in FIG. 1.

In a specific embodiment, referring to FIG. 4, the lateral surface 16 of the first electrical conductor 11 can be an outer lateral surface 16a or an inner lateral surface 16b. For example, the inner lateral surface 16b is the inner wall of the concave part 18 of the first electrical conductor 11. Of course, the conductive connection portion 15 can be electrically connected with the outer lateral surface 16a and for the inner lateral surface 16b of the lateral surface 16 of the first electrical conductor 11, that is, the at least one lateral surface 16 of the first electrical conductor 11 may include an outer lateral surface 16a and/or an inner lateral surface 16b.

In order to further increase the electrical connection area between the conductive connection portion 15 and the first electrical conductor 11, referring to FIG. 4, for example, the conductive connection portion 15 can be electrically connected with two outer lateral surfaces 16a of the first electrical conductor 11. Such a design can further increase the electrical connection area between the conductive connection portion 15 and the first electrical conductor 11, and thus can effectively prevent the poor contact between the first electrical conductor 11 and the conductive connection portion 15 in the first via hole 14.

Figure 5:
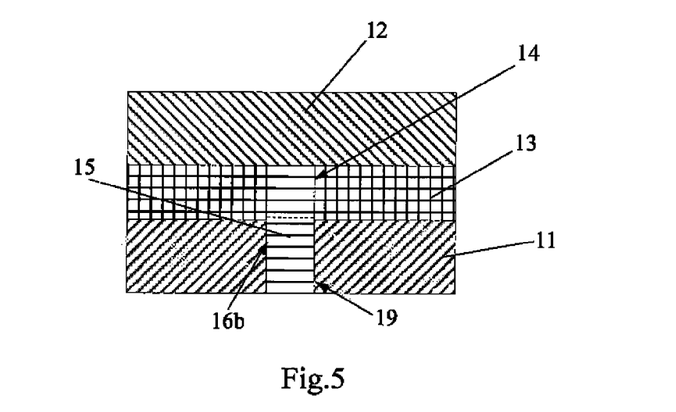
FIG. 5 is a sectional view of the first electrical conductor, in FIG. 1, provided with a through-hole concave part.
Figure 6:
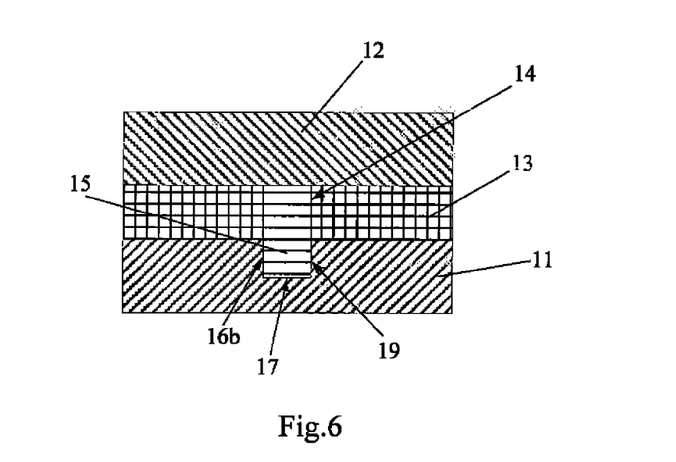
FIG. 6 is a sectional view of the first electrical conductor, in FIG. 1, provided with a blind-hole concave part.

In order to avoid a too large aperture of the first via hole 14, that is, to avoid a too large upper surface of the conductive connection portion 15, and to further increase the electrical connection area between the conductive connection portion 15 and the first electrical conductor 11, in at least one embodiment, the first electrical conductor 11 is provided with a concave part 18, the concave part can be a hole-shaped concave part 19 or a groove type concave part 20, and the hole-shaped concave part 19 is a through-hole concave part 19 or a blind-hole concave part 19. Referring to FIG. 5, the conductive connection portion 15 is electrically connected with an inner lateral surface 16b of a through-hole concave part 19 of the first electrical conductor 11; or referring to FIG. 6, the conductive connection portion 15 is electrically connected with an inner lateral surface 16b and an upper surface 17, which is provided in the hole, of a blind-hole concave part 19 of the first electrical conductor 11; or referring to FIG. 7, the conductive connection portion 15 is electrically connected with an inner lateral surface 16b of a groove type concave part 20 of the first electrical conductor 11.

Figure 7:
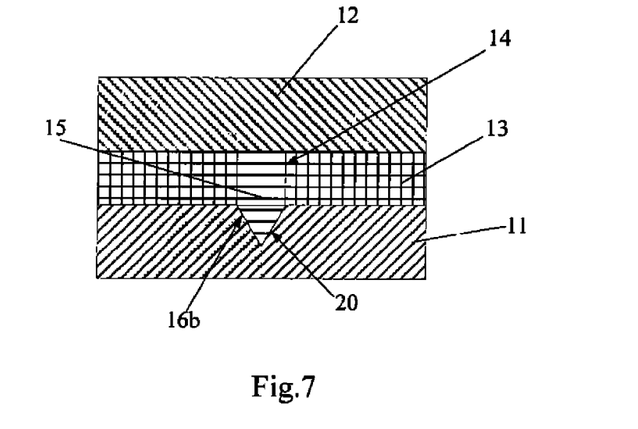
FIG. 7 is a sectional view of the first electrical conductor, in FIG. 1, provided with a groove type concave part.
Figure 8:
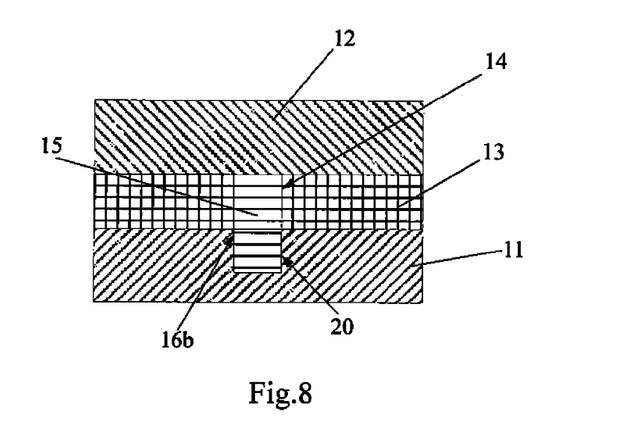
FIG. 8 is another sectional view of the first electrical conductor, in FIG. 1, provided with a groove type concave part.
Figure 9:
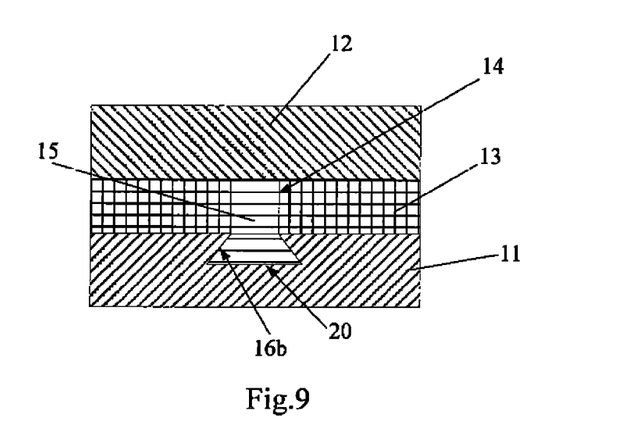
FIG. 9 is another sectional view of the first electrical conductor, in FIG. 1, provided with a groove type concave part.

It's to be noted that, the cross section shape of the above-mentioned groove type concave part 20 is not limited to a triangle as shown in FIG. 7, any other cross section shape of the groove type concave part 20 is suitable for the embodiments of the present disclosure, and for example, referring to FIG. 8 and FIG. 9, the cross section shape of the groove type concave part 20 can also be rectangular or trapezoidal, etc.

In the above-mentioned embodiments, the conductive connection portion 15 may include a first conducting portion 21 and a second conducting portion 22 which are electrically connected with each other, the first conducting portion 21 is disposed in the first via hole 14, and the second conducting portion 22 is electrically connected with at least one lateral surface 16 of the first electrical conductor 11. For example, the first conducting portion 21 and the second conducting portion 22 are integral formed. For example, the second conducting portion 22 may be arranged at the outer side of the first electrical conductor 11, or the second conducting portion 22 may be arranged in the concave part 18 of the first electrical conductor 11.

Figure 10:
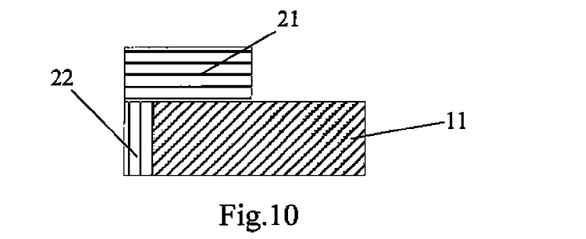
FIG. 10 is another sectional view of the conductive connection portion and the first electrical conductor in FIG. 1.
Figure 11:
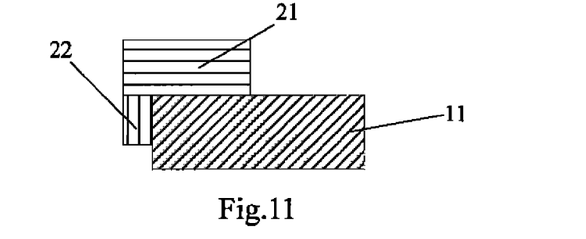
FIG. 11 is another sectional view of the conductive connection portion and the first electrical conductor in FIG. 1.

To adapt to the different forming methods of the array substrate, a plurality of specific structure forms of the above-mentioned conductive connection portion 15 is provided. Referring to FIG. 10 and FIG. 11, for example, the height of the second conducting portion 22 is smaller than or equal to the thickness of the first electrical conductor 11.

In order to realize the electrical connection of a plurality of electrical conductors which are respectively arranged in different layers, for example, the electrical connection of three electrical conductors, at least one embodiment of the present disclosure can include the following two ways.

Figure 12:
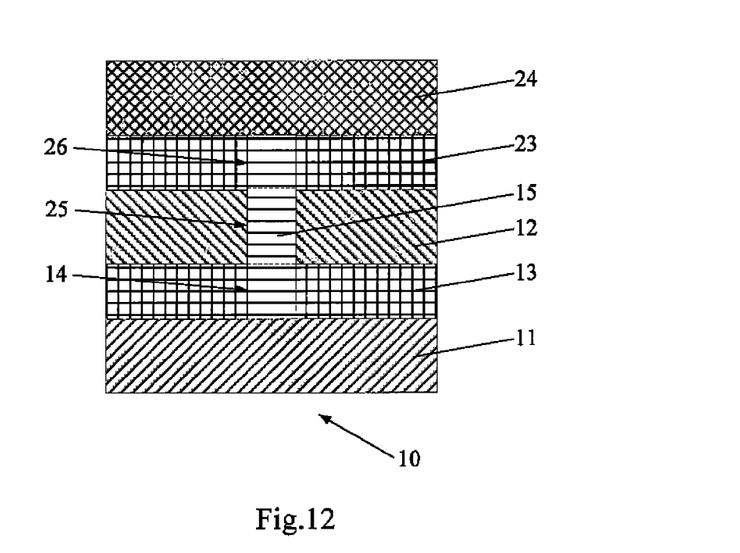
FIG. 12 is another sectional view of the electrical connection structure with the via hole in an embodiment of the present disclosure.

Referring to FIG. 12, one way is, the electrical connection structure with the via hole 10 further includes a second insulating layer 23 disposed on the second electrical conductor 12, and a third electrical conductor 24 disposed on the second insulating layer 23; and the second electrical conductor 12 is provided with a connecting through-hole 25, the second insulating layer 23 is provided with a second via hole 26, an overlapping region is provided between the connecting through-hole 25 and each of the first via hole 14 and the second via hole 26, and the conductive connection portion 15 passes through the connecting through-hole 25 and the second via hole 26 and electrically connects the third electrical conductor 24.

In order to realize the electrical connection of multiple electrical conductors which are arranged in different layers, for example, to realize the electrical connection of the first electrical conductor 11, the second electrical conductor 12 and the third electrical conductor 24 which are arranged in three different layers, and to simplify the production process, in at least one embodiment, the third electrical conductor 24 and the conductive connection portion 15 can be formed at the same time, and in this case, the material of the third electrical conductor 24 is the same as that of the conductive connection portion 15. For example, the conductive connection portion 15 can be an indium tin oxide (hereafter short for ITO) conductive connection portion, and the third electrical conductor 24 can be an ITO conductor.

Figure 13:
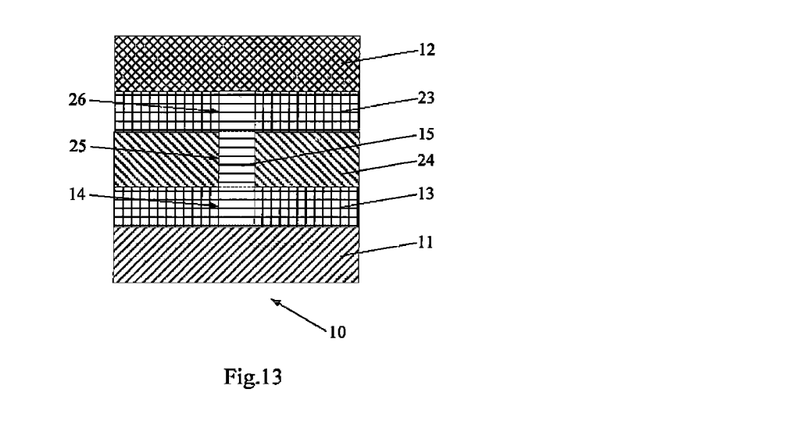
FIG. 13 is another sectional view of the electrical connection structure with the via hole by an embodiment of the present disclosure.
Figure 14:
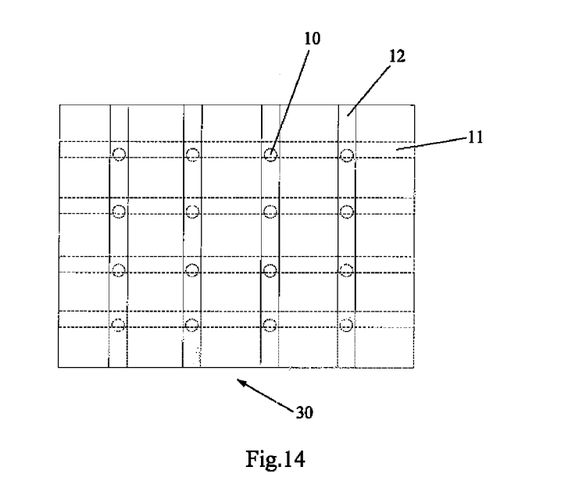
FIG. 14 is a top view of an array substrate in an embodiment of the present disclosure.

The second way is, as shown in FIG. 13, the electrical connection structure with the via hole 10 further includes a third electrical conductor 24 disposed on the first insulating layer 13, and a second insulating layer 23 which is disposed on the third electrical conductor 24 and under the second electrical conductor 12; and the third electrical conductor 24 is provided with a connecting through-hole 25, the second insulating layer 23 is provided with a second via hole 26, an overlapping region is provided between the connecting through-hole 25 and each of the first via hole 14 and the second via hole 26, and the conductive connection portion 15 passes through the connecting through-hole 25 and the second via hole 26 to be electrically connected with the third electrical conductor.

In order to realize the electrical connection of multiple electrical conductors which are arranged in different layers, for example, to realize the electrical connection of the first electrical conductor 11, the second electrical conductor 12 and the third electrical conductor 24 which are arranged in different layers, and to simplify the production process, in at least one embodiment, the second electrical conductor 12 and the conductive connection portion 15 can be formed at the same time, and in this case, the material of the second electrical conductor 12 is the same as that of the conductive connection portion 15. For example, the conductive connection portion 15 can be an ITO conductive connection portion, and the second electrical conductor 12 can be an ITO electrical conductor.

It's to be noted that, the shapes, in a top view, of the above-mentioned connecting through-hole 25 and the second via hole 26 can be any shapes. For example, the shape, in a top view, of the connecting through-hole 25 can also be an oval, a triangle, a rectangle, or any other polygons etc., and the shape, in a top view, of the second via hole 26 can also be an oval, a triangle, a rectangle, or any other arbitrary polygons etc.

Besides, the above-mentioned first via hole 14 in the first insulating layer 13, the concave part 18 in the first electrical conductor 11, the connecting through-hole 25 in the second electrical conductor 12, and the second via hole 26 in the second insulating layer 23 can be formed by one patterning process or a plurality of patterning processes.

Referring to FIG. 12, an embodiment of the present disclosure further provides an array substrate 30, which includes the electrical connection structure with the via hole 10 provided by any one of the above-mentioned embodiments. For example, the array substrate 30 includes a plurality of first electrical conductors 11 arranged in a same layer, a first insulating layer 13 provided on the plurality of the first electrical conductors 11, and a plurality of second electrical conductors 12 arranged on the first insulating layer 13 and in a same layer, the above-mentioned electrical connection structure with the via hole 10 is formed between each of the first electrical conductors 11 and a corresponding second electrical conductor 12 of the plurality of the second electrical conductors 12.

For example, the first electrical conductor 11 is a drain electrode of a thin film transistor, and the second electrical conductor 12 is a pixel electrode.

In the case that the electrical connection structure with the via hole 10 provided by any one of the embodiments of the disclosure is formed between each of the first electrical conductors 11 and a corresponding second electrical conductor 12 which are disposed in the array substrate 30, the conductive connection portion 15 in the first via hole 14 is electrically connected with at least one lateral surface 16 of the first electrical conductor 11, especially in some embodiments, the conductive connection portion 15 can also be electrically connected with the upper surface of the first electrical conductor 11, therefore, compared with the method that the conductive connection portion is only electrically connected with the upper surface of the first electrical conductor, the array substrate can increase the electrical connection area between the conductive connection portion 15 and the first electrical conductor 11, thus can effectively prevent the poor contact between the first electrical conductor 11 (for example a drain electrode) and the conductive connection portion 15 in the first via hole 14, and further can improve the reliability of the electrical connection between the first electrical conductor 11 and the second electrical conductor 12.

An embodiment of the present disclosure further provides a display device, and the display device includes the array substrate 30 according to any one of the above-mentioned embodiments of the present disclosure. The display device can be: a liquid crystal display panel, an electronic paper, an organic light-emitting diode (short for OLED), a mobile phone, a tablet computer, a television, a display, a notebook computer, a digital picture frame, a navigation system and any other product or component having a display function.

In the case that the display device includes the array substrate 30, in which the above-mentioned electrical connection structure with the via hole 10 is formed between each of the first electrical conductors 11 and a corresponding second electrical conductor 12, the conductive connection portion 15 in the first via hole 14 is electrically connected with at least one lateral surface 16 of the first electrical conductor 11, especially in some embodiments, the conductive connection portion 15 can also be electrically connected with the upper surface of the first electrical conductor 11, therefore, compared with the method that the conductive connection portion is only electrically connected with the upper surface of the first electrical conductor, the display device can increase the electrical connection area between the conductive connection portion 15 and the first electrical conductor 11, thus can effectively prevent the poor contact between the first electrical conductor 11 and the conductive connection portion 15 in the first via hole 14, and further can improve the reliability of the electrical connection between the first electrical conductor 11 and the second electrical conductor 12.

The array substrate 30 and the display device provided by the embodiments of the present disclosure can realize the functions of the electrical connection structure with the via hole 10 provided by the above-mentioned embodiments, the description of the electrical connection structure with the via hole 10 in the above-mentioned embodiments can be referred to for the realization of the specific structure, and detailed descriptions will be omitted herein.

The electrical connection structure with the via hole, the array substrate and the display device provided by the embodiments of the present disclosure can be adapted to realizing the electrical connection of different electrical conductors, and embodiments are not limited thereto.

In the description of the above-mentioned embodiments, the specific characteristics, structures, materials or features can be combined in appropriate ways in any one or more of the embodiments or examples.

What are described above is related to the illustrative embodiments of the disclosure only and not limitative to the scope of the disclosure; the scopes of the disclosure are defined by the accompanying claims.

The present application claims the priority of the Chinese Patent Application No. 201420860388.8 filed on Dec. 30, 2014, which is incorporated herein by reference as part of the disclosure of the present application.

The invention claimed is:

1. An electrical connection structure with a via hole comprising:
   a first electrical conductor;
   a second electrical conductor;
   a first insulating layer, disposed on the first electrical conductor and under the second electrical conductor, wherein the first insulating layer is provided with a first via hole, and an overlapping region is provided between the first via hole and each of the first electrical conductor and the second electrical conductor; and
   a conductive connection portion, passing through the first via hole, wherein the first electrical conductor and the second electrical conductor are electrically connected through the conductive connection portion, and the conductive connection portion is electrically connected with at least one lateral surface of the first electrical conductor.

2. The electrical connection structure with the via hole according to claim 1, wherein the at least one lateral surface of the first electrical conductor comprises an outer lateral surface and/or an inner lateral surface.

3. The electrical connection structure with the via hole according to claim 2, wherein the conductive connection portion is electrically connected with two outer lateral surfaces of the first electrical conductor.

4. The electrical connection structure with the via hole according to claim 2, wherein the first electrical conductor is provided with a concave part, and the concave part comprises a hole-shaped concave part or a groove type concave part.

5. The electrical connection structure with the via hole according to claim 4, wherein the hole-shaped concave part comprises a through-hole concave part or a blind-hole concave part; and the conductive connection portion is electrically connected with an inner lateral surface of the through-hole concave part of the first electrical conductor, or the conductive connection portion is electrically connected with an inner lateral surface and an upper surface of the blind-hole concave part of the first electrical conductor.

6. The electrical connection structure with the via hole according to claim 4, wherein the conductive connection portion is electrically connected with an inner lateral surface of the groove type concave part of the first electrical conductor.

7. The electrical connection structure with the via hole according to claim 1, wherein the conductive connection portion comprises a first conducting portion and a second conducting portion which are electrically connected with each other, the first conducting portion is disposed in the first via hole, and the second conducting portion is electrically connected with the at least one lateral surface of the first electrical conductor.

8. The electrical connection structure with the via hole according to claim 1, further comprising: a third electrical conductor which is disposed on the first insulating layer, and a second insulating layer which is disposed on the third electrical conductor and under the second electrical conductor; wherein
   the third electrical conductor is provided with a connecting through-hole, the second insulating layer is provided with a second via hole, an overlapping region is provided between the connecting through-hole and each of the first via hole and the second via hole, and the conductive connection portion passes through the connecting through-hole and the second via hole and electrically connects the third electrical conductor.

9. The electrical connection structure with the via hole according to claim 1, further comprising: a second insulating layer which is disposed on the second electrical conductor, and a third electrical conductor which is disposed on the second insulating layer; wherein the second electrical conductor is provided with a connecting through-hole, the second insulating layer is provided with a second via hole, an overlapping region is provided between the connecting through-hole and each of the first via hole and the second via hole, and the conductive connection portion passes through the connecting through-hole and the second via hole and electrically connects the third electrical conductor.

10. The electrical connection structure with the via hole according to claim 1, wherein a material of the second electrical conductor is the same as a material of the conductive connection portion.

11. The electrical connection structure with the via hole according to claim 9, wherein a material of the third electrical conductor is the same as a material of the conductive connection portion.

12. The electrical connection structure with the via hole according to claim 11, wherein the conductive connection portion comprises an indium tin oxide conductive connection portion, the third electrical conductor comprises an indium tin oxide electrical conductor.

13. An array substrate comprising the electrical connection structure with the via hole claimed as claim 1.

14. A display device comprising the array substrate claimed as claim 13.

15. The electrical connection structure with the via hole according to claim 2, wherein the conductive connection portion comprises a first conducting portion and a second conducting portion which are electrically connected with each other, the first conducting portion is disposed in the first via hole, and the second conducting portion is electrically connected with the at least one lateral surface of the first electrical conductor.

16. The electrical connection structure with the via hole according to claim 2, further comprising: a third electrical conductor which is disposed on the first insulating layer, and a second insulating layer which is disposed on the third electrical conductor and under the second electrical conductor; wherein the third electrical conductor is provided with a connecting through-hole, the second insulating layer is provided with a second via hole, an overlapping region is provided between the connecting through-hole and each of the first via hole and the second via hole, and the conductive connection portion passes through the connecting through-hole and the second via hole and electrically connects the third electrical conductor.

17. The electrical connection structure with the via hole according to claim 2, further comprising: a second insulating layer which is disposed on the second electrical conductor, and a third electrical conductor which is disposed on the second insulating layer; wherein the second electrical conductor is provided with a connecting through-hole, the second insulating layer is provided with a second via hole, an overlapping region is provided between the connecting through-hole and each of the first via hole and the second via hole, and the conductive connection portion passes through the connecting through-hole and the second via hole and electrically connects the third electrical conductor.

18. The electrical connection structure with the via hole according to claim 2, wherein a material of the second electrical conductor is the same as a material of the conductive connection portion.

19. The electrical connection structure with the via hole according to claim 3, wherein the conductive connection portion comprises a first conducting portion and a second conducting portion which are electrically connected with each other, the first conducting portion is disposed in the first via hole, and the second conducting portion is electrically connected with the at least one lateral surface of the first electrical conductor.

20. The electrical connection structure with the via hole according to claim 4, wherein the conductive connection portion comprises a first conducting portion and a second conducting portion which are electrically connected with each other, the first conducting portion is disposed in the first via hole, and the second conducting portion is electrically connected with the at least one lateral surface of the first electrical conductor.

* * * * *